(12) United States Patent
Gu

(10) Patent No.: US 7,019,980 B2
(45) Date of Patent: Mar. 28, 2006

(54) PACKAGED STRUCTURE OF PCMCIA CARTRIDGE

(76) Inventor: Cai-Ting Gu, No.90, Yongsing Rd., Sindian City, Taipei County 231 (TW)

( * ) Notice: Subject to any disclaimer, the term of this patent is extended or adjusted under 35 U.S.C. 154(b) by 311 days.

(21) Appl. No.: 10/743,420

(22) Filed: Dec. 22, 2003

(65) Prior Publication Data

US 2005/0207126 A1    Sep. 22, 2005

(51) Int. Cl.
*H05K 1/14* (2006.01)
(52) U.S. Cl. ...................................... 361/737
(58) Field of Classification Search ............... 174/52.1; 361/737, 752
See application file for complete search history.

(56) References Cited

U.S. PATENT DOCUMENTS

| 6,381,144 B1 * | 4/2002 | Chiang ........................ 361/737 |
| 6,639,805 B1 * | 10/2003 | Chen ........................... 361/737 |
| 6,667,888 B1 * | 12/2003 | Chang et al. ................ 361/737 |
| 6,735,656 B1 * | 5/2004 | Hanke et al. ................ 710/301 |
| 6,849,801 B1 * | 2/2005 | Ming-Hui et al. .......... 174/52.1 |
| 6,888,726 B1 * | 5/2005 | Kasuya et al. .............. 361/737 |
| 6,970,359 B1 * | 11/2005 | Gochnour et al. ........... 361/737 |
| 2002/0039284 A1 * | 4/2002 | Hsu ........................... 361/737 |
| 2002/0159239 A1 * | 10/2002 | Amie et al. ................. 361/737 |
| 2003/0231472 A1 * | 12/2003 | Tseng et al. ................ 361/737 |
| 2004/0252466 A1 * | 12/2004 | Bor-Ren ..................... 361/737 |

* cited by examiner

*Primary Examiner*—Hung V. Ngo
(74) *Attorney, Agent, or Firm*—Leong C. Lei

(57) ABSTRACT

This invention provides a plastic frame to be a separated device so as to combine the lower metal cover, wherein the plastic frame has two extend shafts that are covered with two wrap-sides beside the lower metal cover. Furthermore, the packaged structure of the present invention can effectively apply the elastic-press method by at least one seam on the principal part of the plastic frame to fix two metal covers and the plastic frame. Moreover, the packaged structure of the present invention has a plurality of convexes in at least one seam on the principal part and the ends of two extend shafts of the plastic frame to press and combine two metal covers.

7 Claims, 8 Drawing Sheets

PACKAGED STRUCTURE OF PCMCIA CARTRIDGE

BACKGROUND OF THE INVENTION

1. Field of the Invention

The present invention is related to a structure of electric interface cartridge and more particular, to a packaged structure of PCMCIA cartridge.

2. Description of the Prior Art

Many smart electronic apparatus, such as computers and various peripherals thereof, are widely employed in different fields. As the fast innovation of electronic technology, both hardware and software improves quickly and continuously. PCMCIA cartridge (Personal Computer Memory Cartridge International Association) is a memory cartridge's standard formulated by America and Japan, and it is always used in notebook. For the notebook, there are three interface types, such as PCMCIA I, PCMCIA II and PCMCIA III, to expand abilities of notebook for connecting extended memory, network cartridge, modem or SCSI system (Small Computer System Interface or Small Computer Standard Interface), such as high capacity HD (HARD DISC) or scanner. In general, the PCMCIA can also be transformed into the other interfaces, such as PCMCIA to SCSI or PCMCIA to IDE (Integrated Drive Electronics or Intelligent Device Electronics), for connecting to apparatuses with various interfaces. At present, the greater part of notebooks can support Plug and Play so that the PCMCIA cartridge can be hot plugged, that is, the PCMCIA cartridge can be plugged in or pull out without reboot. Conventional PCMCIA interface has 8 MHz and card bus width with 8 or 16 bit, but new the PC Cartridge Standard has 20/33 MHz and cardbus width 32 bit to form the transmission rate with 132 MBps, which applies the technique of PCI bus (Peripheral Component Interconnect) to support the interface of PCMCIA cartridge in notebook with 68 Pins.

Conventionally, the packaged structure of PCMCIA cartridge usually applied metal cover to metal cover to directly hook up from each other, but this way cannot take apart the packaged structure after finishing package so that this cartridge cannot be maintain or exchanged when it damage; especially, this way fix and package the structure of this PCMCIA cartridge by hook up the trench beside COM port, and it is hard to take apart. Furthermore, there are the intervals between the metal cover and the plastic structure so that the whole structure is easy to be loose, and it also results in increasing the packaging devices. Moreover, another packaged structure of PCMCIA cartridge applies plastic injection to directly form the plastic around the sidewall of the metal cover, but this packaging method make the metal cover scrapes to damage the plastic part when packaging the metal cover with the plastic part, so the large intervals are necessary to avoid damaging the plastic part that the packaging devices are loose after finishing package process and these devices are easy to separate from the large intervals. Accordingly, there are still lots of limitations and problems on the conventional packaged structure of PCMCIA cartridge that need to be overcome.

SUMMARY OF THE PRESENT INVENTION

In accordance with the present invention, a new packaged structure of PCMCIA cartridge is provided that substantially overcomes the drawbacks of above problems mentioned from the packaging process.

One object of the present invention is to provide a packaged structure of PCMCIA cartridge. This invention provides a plastic frame to be a separated device so as to combine the lower metal cover, wherein the plastic frame has two extend shafts that are covered with two wrap-sides beside the lower metal cover, whereby two extend shafts of the plastic frame can be protected from the upper metal cover, and this structure can be assembled by handwork. Furthermore, the packaged structure of the present invention can effectively apply the elastic-press method by at least one seam on the principal part of the plastic frame to fix two metal covers and the plastic frame, so as to secure entirety and avoid dispersing the packaged devices. Moreover, this structure of the present invention has a plurality of convexes in at least one seam on the principal part and the ends of two extend shafts of the plastic frame to press and combine two metal covers, whereby this structure can be easy to take apart and assemble. Therefore, the present invention corresponds to economic effect and utilization in industry.

Accordingly, the present invention discloses a packaged structure of PCMCIA cartridge comprising a first plastic cover, a first metal cover, a second plastic cover and a second metal cover, wherein the size of the first metal cover is about equal to the size of the second metal cover. The first plastic cover has a principle part and two shafts extended along the sidewalls of the principle part. The principle part of the first plastic cover has at least one first seam and two first fillisters located on the front ends of the two shafts, and a second seam is located on the hind end of each shaft, wherein a plurality of convexes are formed in at least one first seam and two second seams to generate elastic influence while the first metal cover and the second metal cover are pressed and combined from each other. Each hind end of each shaft has one second fillister beside the second seam to combine the first metal cover and the second metal cover together. At least one first strip is formed on the upper side of the first metal cover to plug into at least one first seam in the principle part of the first plastic cover. The first metal cover has two first hooks located on the front sidewalls to plug into two first fillisters located on the front ends of the two shafts; and it has two first wrap-sides located on middle sidewalls to cover two shafts, so as to protect the main parts of two shafts, wherein the length of each first wrap-side is about equal to the main part of each shaft; and it has two first wings located on two hind sidewalls to press into two second seams located on the hind ends of two shafts and touch the plurality of convexes in two second seams located on hind ends of two shafts. Two second hooks are formed on the lower side of the first metal cover beside two first wings so as to plug into two second fillisters located on the hind ends of the two shafts. At least one second strip is formed on the upper side of the second metal cover to connect with one side of the second plastic cover, wherein the size of the second plastic cover is about equal to the principle part of the first plastic cover so as to connect from each other. The second metal cover has two second wrap-sides located on middle sidewalls to cover two first wrap-sides of the first metal cover, so as to connect with the first metal cover and the second metal cover, wherein the length of each second wrap-side is about equal to the length of each first wrap-side; and it has two second wings located on two hind sidewalls to press into two second seams located on the hind ends of two shafts and touch the plurality of convexes in two second seams located on hind ends of two shafts. Two third hooks are formed on the lower side of the second metal cover beside two second wings so as to plug into two second fillisters located on the hind ends of the two shafts.

DESCRIPTION OF THE PREFERRED EMBODIMENT

The present invention is related to an electric cartridge. The structure will now be described in greater detail to make the present invention more readily appreciated. Obviously, the present invention should not be limited in the details known to those skilled in the art, and well known devices will not be described herein to avoid unnecessary limitations. Preferred embodiments will now be described in greater detail. Nevertheless, it should be recognized that the present invention can be practiced in a wide range of other embodiments besides those explicitly described, and the scope of the present invention is expressly not limited except as specified in the accompany claims.

Reference is now made to FIG. 1A to FIG. 1D, in one embodiment of the present invention, first of all, a packaged structure 100 of PCMCIA cartridge is provided, it comprising a first plastic cover 110, a first metal cover 120, a second plastic cover 130, a second metal cover 140 and a circuit board 105, wherein the size of the first metal cover 120 is about equal to the size of the second metal cover 140. The first plastic cover 110 has a principle part 150 and two shafts 160 extended along the sidewalls of the principle part 150. The principle part 150 of the first plastic cover 110 has at least one first seam 170A and two first fillisters 180A located on the front ends 160A of the two shafts 160, and a second seam 170B is located on the hind end 160C of each shaft 160, wherein a plurality of convexes 190 are formed in at least one first seam 170A and two second seams 170B to generate elastic influence while the first metal cover 120 and the second metal cover 140 are pressed and combined from each other. Each hind end 160C of each shaft 160 has one second fillister 180B beside the second seam 170B to combine the first metal cover 120 and the second metal cover 140 together. At least one first strip 200A is formed on the upper side 120A of the first metal cover 120 to plug into at least one first seam 170A in the principle part 150 of the first plastic cover 110. The first metal cover 120 has two first hooks 210A located on the front sidewalls 120B to plug into two first fillisters 180A located on the front ends 160A of the two shafts 160, as shown in FIG. 4; and it has two first wrap-sides 220A located on middle sidewalls 120C to cover two shafts 160B, so as to protect the main parts 160B of two shafts 160, wherein the length of each first wrap-side 220A is about equal to the main part 160B of each shaft 160; and it has two first wings 230A located on two hind sidewalls 120D to press into two second seams 170B located on the hind ends 160C of two shafts 160 and touch the plurality of convexes 190 in two second seams 170B located on hind ends 160C of two shafts 160, as shown in FIG. 2. Two second hooks 210B are formed on the lower side 120E of the first metal cover 120 beside two first wings 230A so as to plug into two second fillisters 180B located on the hind ends 160C of the two shafts 160. At least one second strip 200B is formed on the upper side 140A of the second metal cover 140 to connect with one side of the second plastic cover 130, wherein the size of the second plastic cover 130 is about equal to the principle part 150 of the first plastic cover 110 so as to connect from each other. The second metal cover 140 has two second wrap-sides 220B located on middle sidewalls 140B to cover two first wrap-sides 220A of the first metal cover 120, so as to connect with the first metal cover 120 and the second metal cover 140, wherein the length of each second wrap-side 220B is about equal to the length of each first wrap-side 220A; and it has two second wings 230B located on two hind sidewalls 140C to press into two second seams 170B located on the hind ends 160C of two shafts 160 and touch the plurality of convexes 190 in two second seams 170B located on hind ends 160C of two shafts 160, as shown in FIG. 3. Two third hooks 210C are formed on the lower side 140D of the second metal cover 140 beside two second wings 230B so as to plug into two second fillisters 180B located on the hind ends 160C of the two shafts 160, wherein an opening is formed between two third hooks 210C to expose connector of the circuit board 105. Therefore, entirety of PCMCIA cartridge that has been finished packaging is shown in FIG. 5, wherein the circuit board 105 is packaged between the first plastic cover 110 and the second metal cover 140.

Accordingly, in the preferred embodiments of the present invention, this invention provides a plastic frame having two shafts that are covered with two wrap-sides so as to protect two shafts from the upper metal cover. Especially, the packaged structure of the present invention can effectively apply the elastic-press method by at least one seam on the principal part of the plastic frame to fix two metal covers and the plastic frame, so as to secure entirety and avoid dispersing the packaged devices. Moreover, this invention designs a plurality of convexes in at least one seam on the principal part and the ends of two extend shafts of the plastic frame to press and combine two metal covers, whereby this structure can be easy to take apart and assemble.

Obviously, many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

Figure 1A:
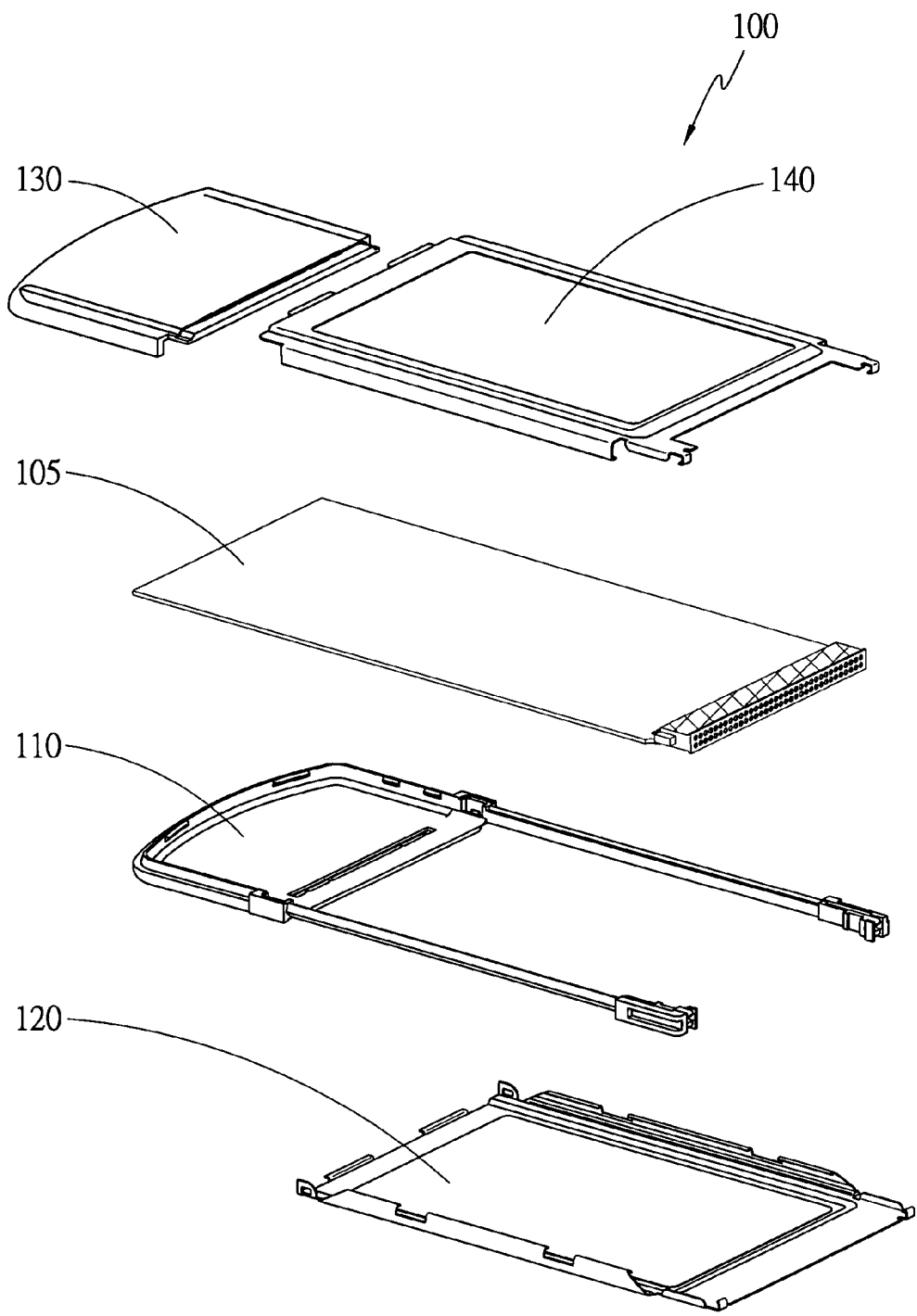
FIG. 1A to FIG. 1D shown illustrations for decomposing the packaged structure of PCMCIA cartridge in accordance with one preferred embodiment in the present invention.
Figure 1B:
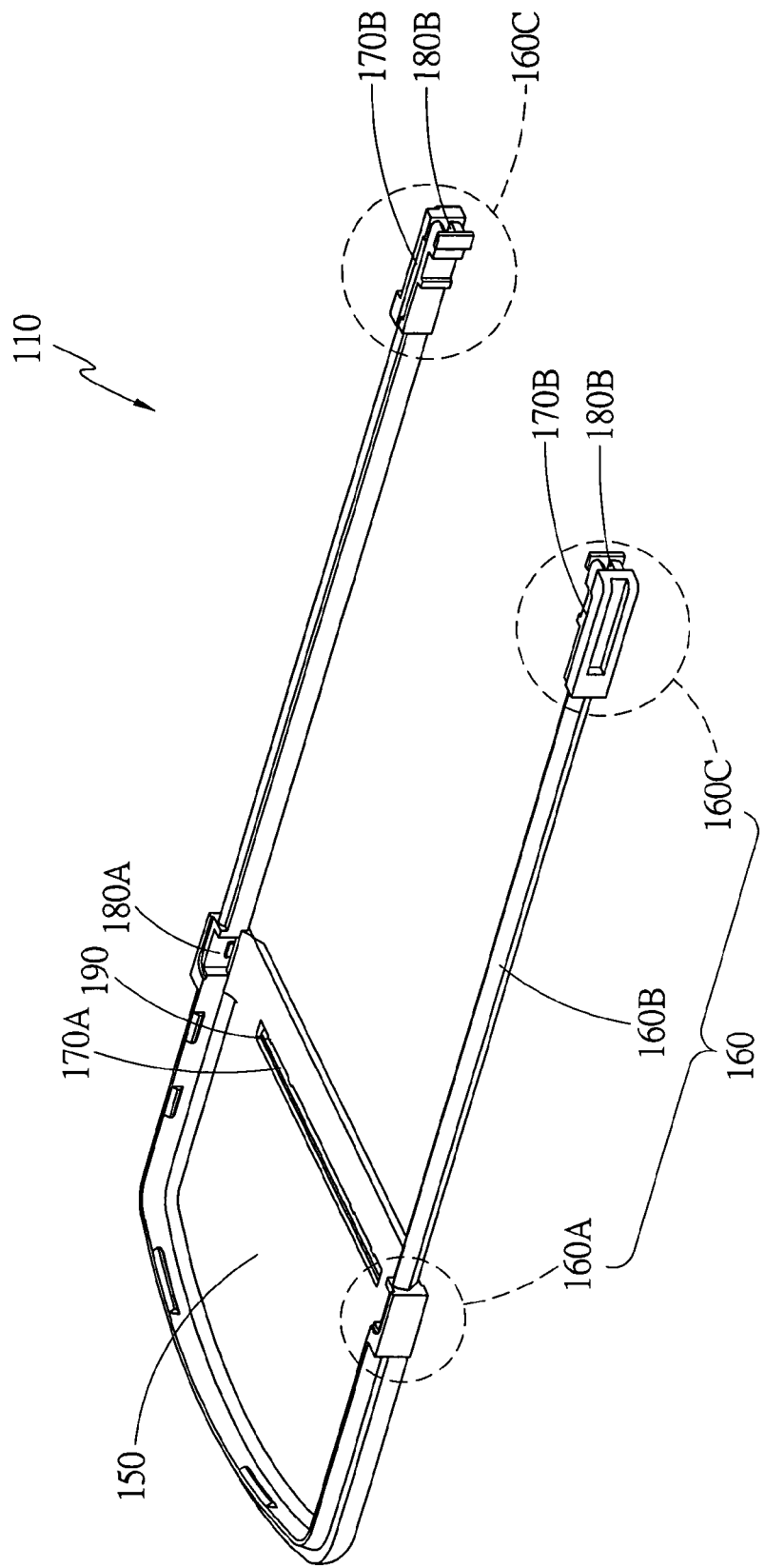
Figure 1C:
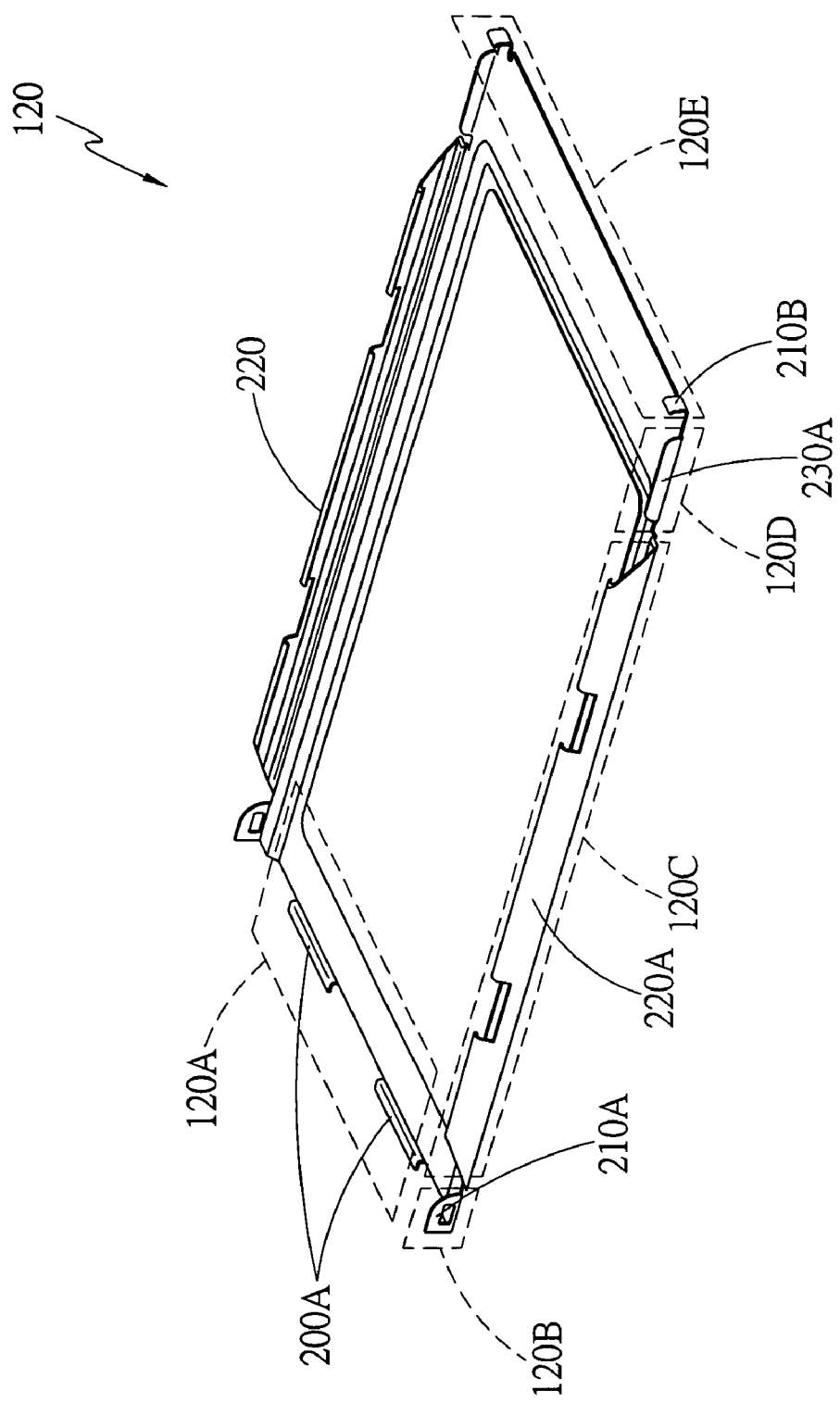
Figure 1D:
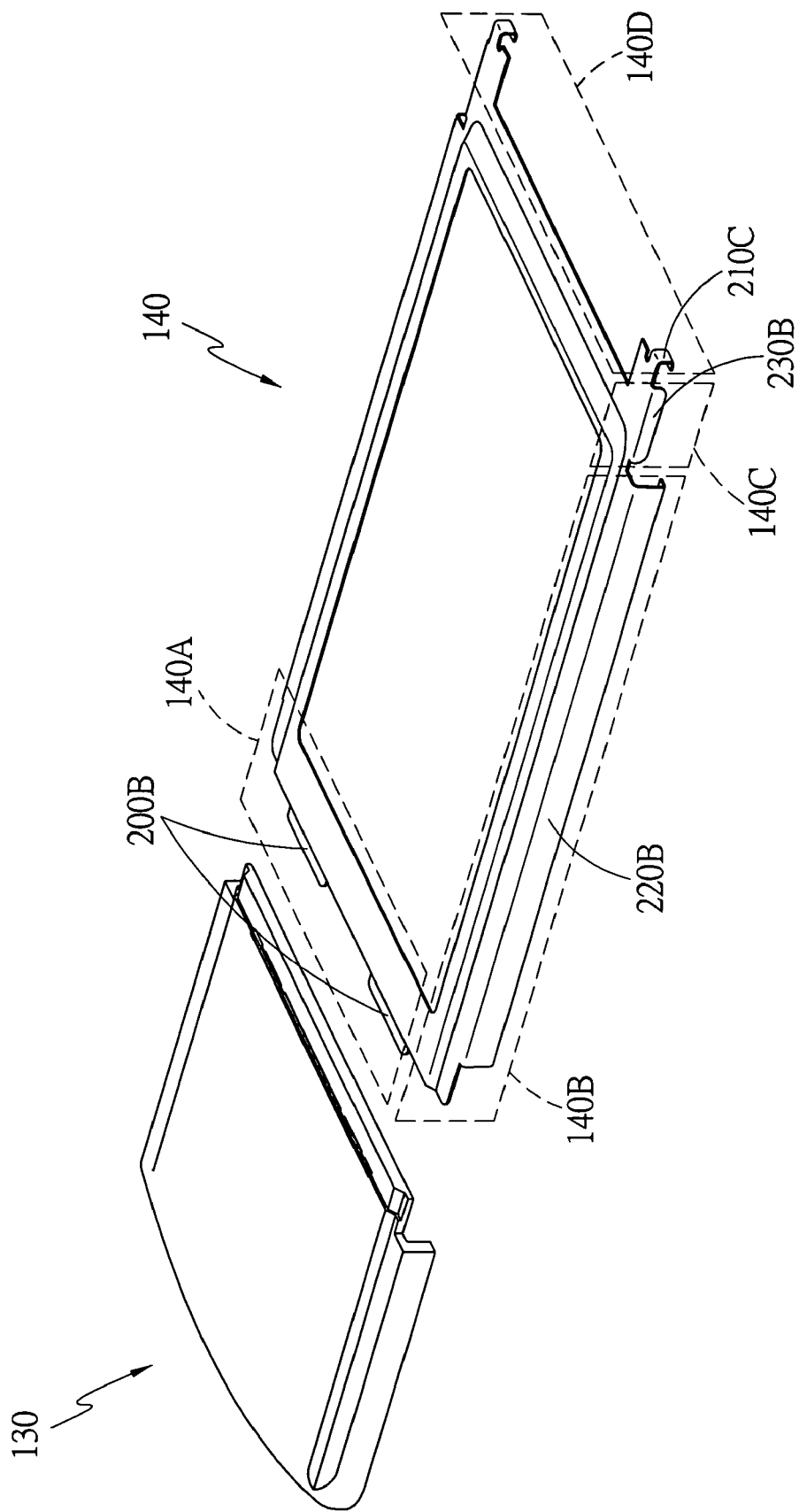
Figure 2:
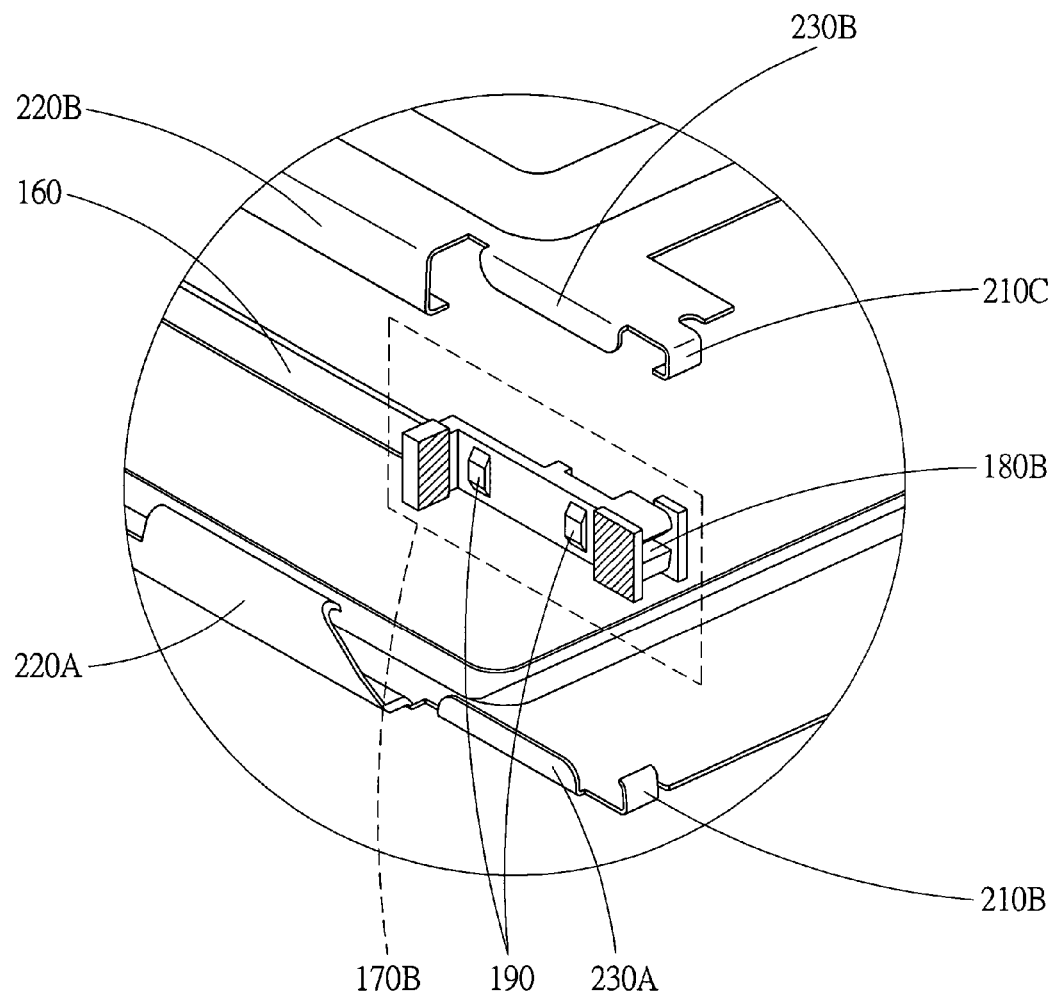
FIG. 2 to FIG. 4 shown detail illustrations for decomposing the packaged structure of PCMCIA cartridge in accordance with one preferred embodiment in the present invention.
Figure 3:
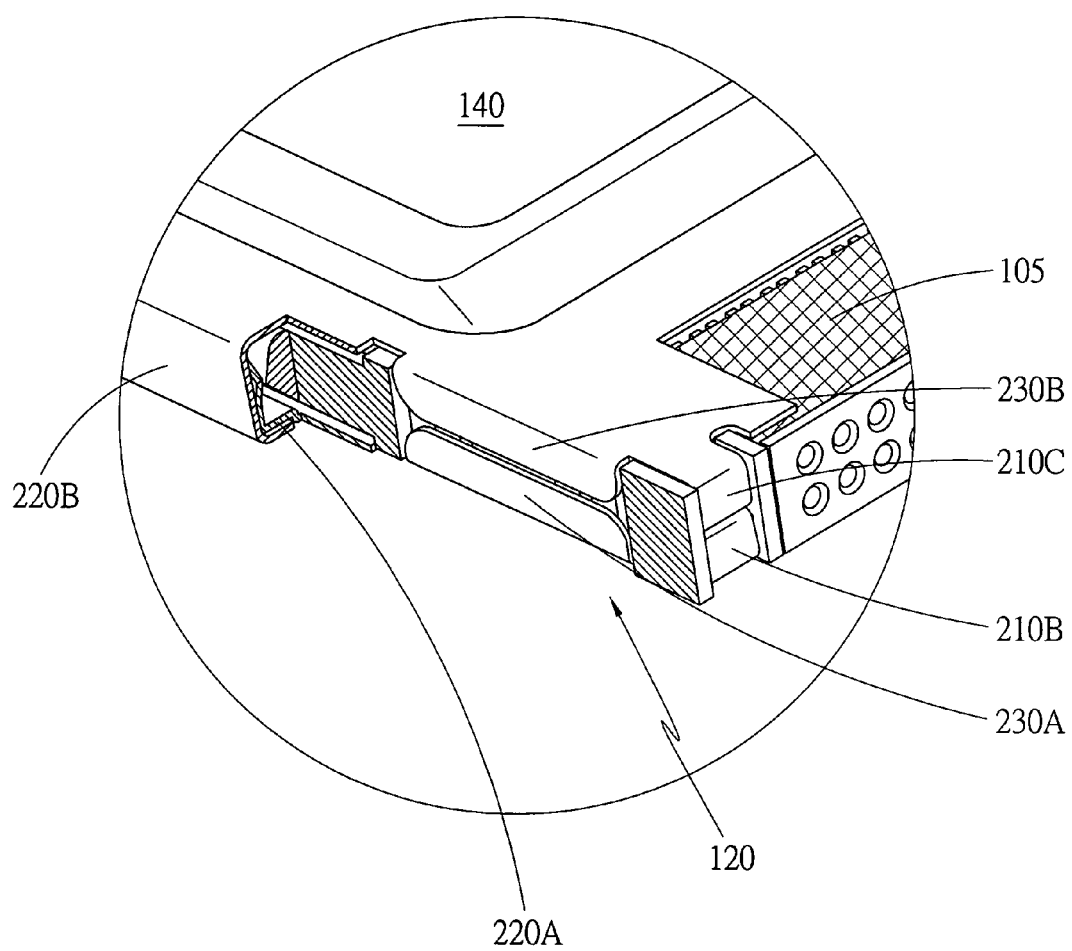
Figure 4:
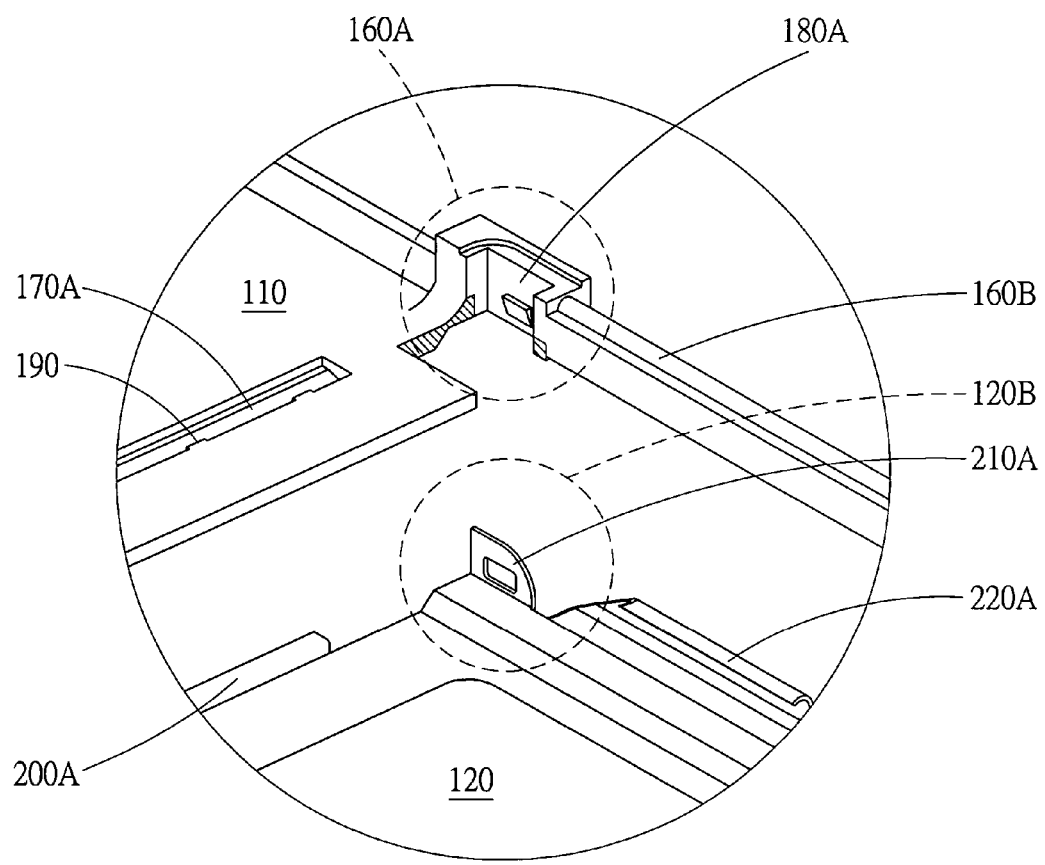
Figure 5:
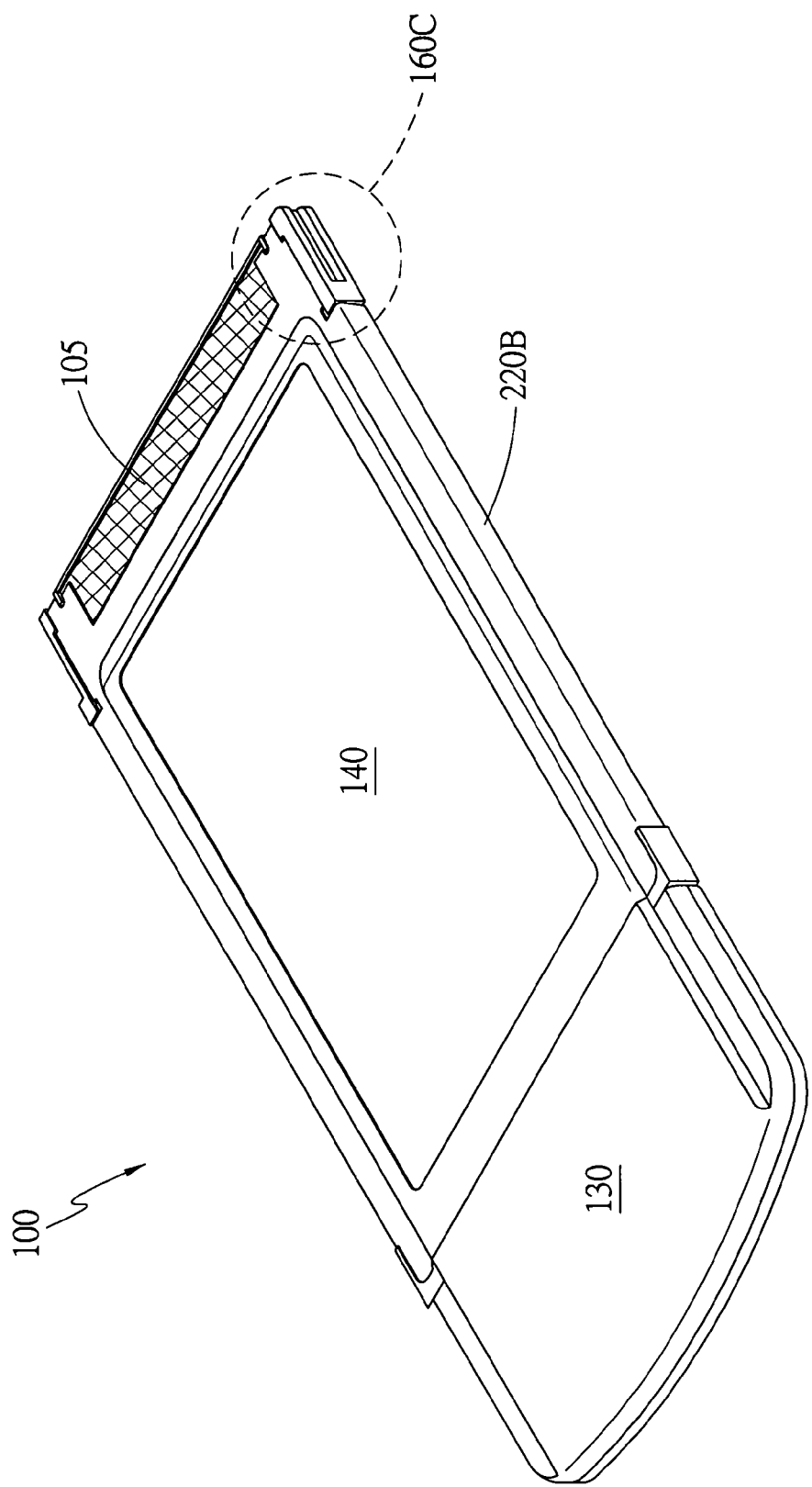
FIG. 5 shown an illustration of the entire packaged structure of PCMCIA cartridge in accordance with one preferred embodiment in the present invention. structure of PCMCIA cartridge in accordance with one preferred embodiment in the present invention.

What is claimed is:

1. A packaged structure of PCMCIA cartridge, comprising:
    a first plastic cover having a principle part and two shafts extended along the sidewalls of said principle part, said principle part has at least one first seam and two first fillisters located on the front ends of said two shafts, wherein a second seam is located on the hind end of each said shaft, and each hind end of each said shaft has a second fillister beside said second seam, and a plurality of convexes are formed in at least one said first seam and two said second seams;
    a first metal cover having two first hooks located on the front sidewalls to plug into two said first fillisters and two first wrap-sides located on middle sidewalls to cover two said shafts, said first metal cover has two first wings located on two hind sidewalls to press into two said second seams and touch the plurality of convexes in two said second seams, wherein two second hooks are formed on the lower side of said first metal cover beside two said first wings so as to plug into two said second fillisters;

a second metal cover having two second wrap-sides located on middle sidewalls to cover two said first wrap-sides and two second wings located on two hind sidewalls to press into two said second seams and touch said plurality of convexes in two second seams located on hind ends of two said shafts, wherein two third hooks are formed on the lower side of said second metal cover beside two said second wings so as to plug into two said second fillisters;

a second plastic cover, said second plastic cover is connected with one side of said second metal cover by at least one second strip formed on the upper side of said second metal cover; and a circuit board, said circuit board is packaged between said first plastic cover and said second metal cover.

2. The packaged structure of PCMCIA cartridge according to claim 1, wherein the size of said first metal cover is about equal to the size of said second metal cover.

3. The packaged structure of PCMCIA cartridge according to claim 1, wherein the upper side of said first metal cover comprises at least one first strip to plug into at least one said first seam in said principle part of said first plastic cover.

4. The packaged structure of PCMCIA cartridge according to claim 1, wherein the length of each said first wrap-side is about equal to the main part of each said shaft.

5. The packaged structure of PCMCIA cartridge according to claim 1, wherein the size of said second plastic cover is about equal to said principle part of said first plastic cover.

6. The packaged structure of PCMCIA cartridge according to claim 1, wherein the length of each said second wrap-side is about equal to the length of each said first wrap-side.

7. The packaged structure of PCMCIA cartridge according to claim 1, wherein an opening is formed between two said third hooks to expose the connector of said circuit board.

* * * * *